(12) United States Patent
Pritelli et al.

(10) Patent No.: US 10,046,663 B2
(45) Date of Patent: Aug. 14, 2018

(54) ELECTRONIC DEVICE FOR CONTROLLING THE ELECTRIC CHARGE OF A LOAD ELECTRICALLY SUPPLIED BY A BATTERY PACK AND SYSTEM FOR MOVING AN ELECTRIC OR HYBRID TRACTION VEHICLE USING THE DEVICE

(71) Applicant: MAGNETI MARELLI S.p.A., Corbetta, Milan (IT)

(72) Inventors: Danilo Pritelli, Bologna (IT); Rosanna Suglia, Bologna (IT); Gianluca Aurilio, Caserta (IT); Franco Ciampolini, Bologna (IT)

(73) Assignee: MAGNETI MARELLI S.p.A., Corbetta (IT)

( * ) Notice: Subject to any disclaimer, the term of this patent is extended or adjusted under 35 U.S.C. 154(b) by 262 days.

(21) Appl. No.: 14/953,906

(22) Filed: Nov. 30, 2015

(65) Prior Publication Data

US 2016/0152156 A1 Jun. 2, 2016

(30) Foreign Application Priority Data

Dec. 1, 2014 (IT) .............................. MI2014A2062

(51) Int. Cl.
*H02J 7/00* (2006.01)
*B60L 11/18* (2006.01)
(Continued)

(52) U.S. Cl.
CPC ......... *B60L 11/1861* (2013.01); *B60L 3/0046* (2013.01); *B60L 3/04* (2013.01); *B60L 11/1803* (2013.01); *B60L 11/1866* (2013.01); *B60L 11/1877* (2013.01); *H01H 9/542* (2013.01); *H03K 17/785* (2013.01); *B60L 2210/10* (2013.01); *B60L 2240/547* (2013.01);
(Continued)

(58) Field of Classification Search
CPC .................................................. B60L 11/1861
USPC .......................................................... 320/136
See application file for complete search history.

(56) References Cited

U.S. PATENT DOCUMENTS 6,459,167 B1 10/2002 Yamanashi
2013/0257149 A1* 10/2013 White .................. H02J 7/0031
307/10.1

FOREIGN PATENT DOCUMENTS

DE 102013204541 A1 9/2014
EP 2322376 A2 5/2011
EP 2648311 A2 10/2013

OTHER PUBLICATIONS

Italian Search Report issued by the Italian Patent Office dated Jul. 23, 2015 for Italian Patent Application No. MI2014A002062.

\* cited by examiner

*Primary Examiner* — Suresh Memula
(74) *Attorney, Agent, or Firm* — Howard & Howard Attorneys PLLC (57) ABSTRACT

An electronic device for controlling the electric charge of a load electrically supplied by a battery pack, comprising: a support; a control module integrated in the support; an electric pre-charging circuit of the load controlled by the control module; an electric active discharge circuit of the load controlled by the control module. The electric pre-charging circuit comprises at least one first solid-state switch and is integrated on the support. The electric active discharge circuit comprises at least one second solid-state switch and is integrated on the support. The first solid-state switch and the second solid-state switch work either as a switch or as a variable resistor.

9 Claims, 5 Drawing Sheets

(51) Int. Cl.
    *B60L 3/00*           (2006.01)
    *H03K 17/785*     (2006.01)
    *B60L 3/04*           (2006.01)
    *H01H 9/54*            (2006.01)
    *H02M 1/32*           (2007.01)

(52) U.S. Cl.
    CPC ....... *B60L 2240/80* (2013.01); *B60L 2270/20* (2013.01); *H01H 2009/545* (2013.01); *H02J 2007/0039* (2013.01); *H02M 2001/322* (2013.01); *Y02T 10/7005* (2013.01); *Y02T 10/7044* (2013.01); *Y02T 10/7061* (2013.01); *Y02T 10/7216* (2013.01); *Y02T 10/92* (2013.01)

ELECTRONIC DEVICE FOR CONTROLLING THE ELECTRIC CHARGE OF A LOAD ELECTRICALLY SUPPLIED BY A BATTERY PACK AND SYSTEM FOR MOVING AN ELECTRIC OR HYBRID TRACTION VEHICLE USING THE DEVICE

CROSS-REFERENCE TO RELATED APPLICATIONS

The present application claims priority to and all the benefits of Italian Patent Application No. MI2014A002062, filed on Dec. 1, 2014, which is hereby expressly incorporated herein by reference in its entirety.

BACKGROUND OF THE INVENTION

1. Field of the Invention

The present invention relates to an electronic device integrated in an electric charge accumulator, such as, in particular, a battery pack for electric or hybrid traction vehicles, in particular an electronic device for controlling the electric charge of a load electrically supplied by a battery pack and to an electric or hybrid traction movement system using such an electronic device.

2. Description of the Related Art

Figure 1:
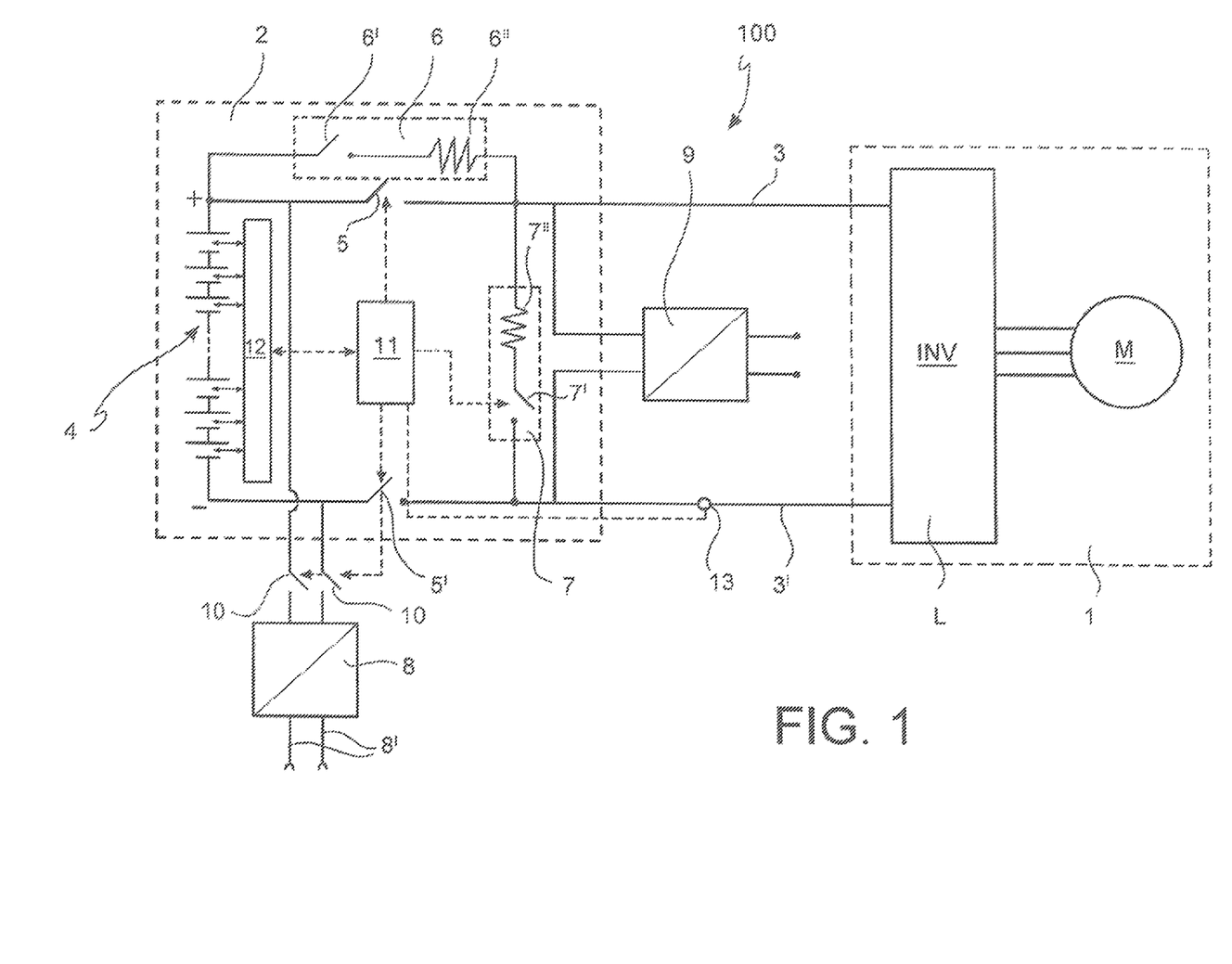
FIG. 1 diagrammatically shows, from an electric point of view, a system for moving an electric or hybrid traction vehicle according to the prior art.

With reference to the diagram in FIG. 1, a system for moving an electric or hybrid traction vehicle 100 typically comprises a load unit 1 (inverter INV and electric motor M) for generating motion and a battery pack 2.

The positive pole (+) of the battery pack 2 is operatively connected to the load unit 1 by means of a first electric terminal or bus 3. The negative pole (−) of the battery pack 2 is operatively connected to the load unit 1 by means of a second electric terminal or bus 3'.

The first electric terminal 3 and the second electric terminal 3' are generically indicated also as DC-BUS or HV DC-BUS.

The inverter INV of the load unit 1 is an example of load, indicated by reference numeral L, electrically supplied by a battery pack 2.

The battery pack 2 comprises a plurality of electric charge electrochemical cells 4 distributed between the positive pole (+) and the negative pole (−).

The positive pole (+) of the battery pack 2 is operatively connected to the first electric terminal 3 by means of an electro-mechanical isolation switch (relay) 5 which can be actuated to exclude the plurality of electrochemical cells 4 from the load unit 1.

The negative pole (−) of the battery pack 2 is operatively connected to the second electric terminal 3' by means of a further electro-mechanical isolation switch (relay) 5' which can be actuated to exclude the plurality of electrochemical cells 4 from the load unit 1.

The battery pack 2 further comprises an electric pre-charging circuit 6 of the load L (inverter INV) by means of the first electric terminal 3.

"Pre-charging" means a step of equalizing adapted to take the electric voltage at the terminals of the load L to the same electric voltage value present at the terminals of the battery pack 2.

Indeed, the load L has high input capacitance and very low electric impedance, and similarly the battery pack 2 is characterized by a very low internal electric impedance.

Therefore, if the load L were electrically connected to the battery pack 2 (by closing the electro-mechanical isolation switch 5), in the presence of significant differences between the electric voltage at the terminals of the load L and the electric voltage at the terminals of the battery pack 2, there would be a very high flow of electric current which could damage the load L and possibly also the battery pack 2.

The electric pre-charging circuit 6, which typically consists of an electro-mechanical switch 6' and a resistor 6" arranged mutually in series, the latter having the purpose of limiting the electric pre-charging current, is interposed between the plurality of electrochemical cells 4 and the first electric terminal 3, thus performing the function of equalizing the electric working voltage at the terminals of the load L, between the first electric terminal 3 and the second electric terminal 3', to the electric voltage at the terminals of the plurality of electrochemical cells 4, and concurrently limiting, as mentioned, the maximum electric current which can circulate between the battery pack 2 and the load L by means of the electric voltage drop on the resistor 6".

Furthermore, in such an electric pre-charging circuit 6, the pattern of the electric pre-charging current has a typically decreasing exponential pattern over time and this does not allow to optimize the duration time of the step of pre-charging because the maximum value of the initial electric pre-charging current (at breakaway) must be limited in all cases.

Additionally, such an electric pre-charging circuit 6 cannot complete the step of pre-charging if the load L is resistive in addition to capacitive.

Indeed, in this case, a resistive divider is created between the plurality of electrochemical cells 4 and the resistor of the load L which does not allow to take the electric voltage at the terminals of the load L to the same electric voltage value present at the terminals of the plurality of electrochemical cells 4.

This causes a so-called "inrush current" electric phenomenon in the moment in which the electro-mechanical isolation switch 5 is closed.

In order to avoid this drawback, the electric pre-charging circuit 6 could be made of a DC/DC converter, but this would considerably increase the circuit complexity, and thus also the cost, of the electric pre-charging circuit, and consequently of the battery pack 2.

Referring back to FIG. 1, the battery pack 2 further comprises a so-called electric active discharge circuit 7 of the load L (inverter INV of the load unit 1), interposed between the first electric terminal 3 and the second electric terminal 3'.

"Active discharge" means a quick discharge, e.g. in the order of 100 ms to a few seconds, of the electric working voltage at the terminals of the load L, i.e. between the first electric terminal 3 and the second electric terminal 3', in the moment in which the electro-mechanical isolation switch 5 and the further electro-mechanical isolation switch 5' are opened.

The electric active discharge circuit 7, typically consisting of a respective electro-mechanical switch (relay) 7' and a heat sink (resistor) 7" arranged mutually in series (as shown in FIG. 1), performs the function of rapidly discharging the electric working voltage between the first electric terminal 3 and the second electric terminal 3' (DC BUS), i.e. the electric working voltage at the terminals of the load L, in the moment in which the electro-mechanical isolation switch 5 and the further electro-mechanical isolation switch 5' are opened.

It is worth noting that the battery pack 2 further comprises an electric passive discharge circuit (not shown in the figures) of the load L, typically consisting of a resistor in parallel to the load L and always electrically connected thereto.

Unlike the electric active discharge circuit 7, adapted to allow to discharge the load L with electric current values in the order of even several tens of amperes and electric powers in the order of even several kW (although limited to times of a few tens of a second or a few seconds), the electric passive discharge circuit, again electrically connected to the load L, has much lower discharge current values (in the order of mA) and much more lower electric powers (a few Watts).

Furthermore, in the movement system 100, there may be an AC/DC converter 8 for recharging the battery pack 2 from an external electric power network 8' (diagrammatically shown in FIG. 1 with a pair of terminals) and a DC/DC converter 9 for electrically supplying possible other loads present in the movement system 100 and in general in the electric or hybrid traction vehicle.

The DC/DC 9 converter may be part of the load L to be electrically supplied by the battery pack 2.

The AC/DC converter 8 is connected to the first electric terminal 3 (in particular to the positive pole (+) of the battery pack 2) and to the second electric terminal 3' (in particular to the negative pole (−) of the battery pack 2) by means of respective electro-mechanical isolation switches (relays) 10 adapted to be closed while recharging the battery pack 2 from the external electric power network 8'.

The electric vehicle 100 further comprises a control unit 11 of the battery pack 2, also named BMS (acronym of Battery Management System), configured to actuate the aforesaid electro-mechanical switches (electro-mechanical isolation switches 5, 5' and 10, the electro-mechanical switch 6' of the electric pre-charging circuit 6 and the electro-mechanical switch 7' of the discharge circuit 7).

The control unit 11 is typically included in the battery pack 2 and is electrically connected to a plurality of monitoring modules 12 of the plurality of electric charge electrochemical cells 4, also named BCM (acronym of Battery Cell Monitor), arranged near the plurality of electric charge electrochemical cells 4, as diagrammatically shown in FIG. 1.

The function of the plurality of monitoring modules 12 is to constantly measure the electric and physical parameters of each single electrochemical cell, such as, for example, the electric voltage at its terminals, its temperature or the electric charge present therein.

Once acquired, the information representative of such measurements is communicated to the control unit 11, which is configured to perform, on the basis of such information, a series of operations aimed at preventing the occurrence of anomalous or potentially dangerous conditions which could compromise the integrity of the plurality of electric charge electrochemical cells 4, and thus of the battery pack 2.

Furthermore, the function of the plurality of monitoring modules 12 and of the respective electric circuit is to correctly equalize or balance the electric charge between the cells constituting the battery pack 2.

Referring back to FIG. 1, the movement system 100 further comprises a sensor 13 for detecting the electric current of the battery pack 2, operatively arranged at either the first electric terminal 3 or the second electric terminal 3'.

Firstly, in the technological development of electric or hybrid traction vehicles, the need is strongly felt to reduce as much as possible the dimensions and the complexity of the electric apparatuses aboard the vehicle, and thus of the movement system of an electric or hybrid traction vehicle.

In order to satisfy such a need, the presence of electro-mechanical switches (relays) of the electric pre-charging circuit and of the electric active discharge circuit implies various drawbacks both from the point of view of dimensions, weight and wear of such components during the working life and from the point of view of construction and of wiring of the components themselves in the movement system 100.

Furthermore, the presence of resistors of the electric pre-charging circuit and of the electric active discharge circuit also implies drawbacks caused by the dimensions and wiring of components themselves in the movement system 100.

Additionally, with particular reference to the electric pre-charging circuit 6, the need is also felt to be able to have an electric pre-charging circuit capable of guaranteeing, in the best manner possible, the step of pre-charging and the functionality of a DC/DC converter but with less complex circuitry, and thus with greater construction simplicity.

SUMMARY OF THE INVENTION

It is the object of the present invention to provide an electronic device for controlling the battery charge of a load to be electrically supplied with a battery pack, which can be used, for example, in a movement system of an electric or hybrid traction vehicle, which at least partially allows to solve the drawbacks described above with reference to the prior art, in particular the drawbacks related to the use of electro-mechanical switches and of resistors, and which can guarantee a reliable step of pre-charging, on one hand, and less circuit complexity, small dimensions and low construction costs, on the other.

Such an object is achieved by an electronic device for controlling the electric charge of a load electrically supplied by a battery pack including a support; a control module integrated in the support; and an electric pre-charging circuit of the load, operatively associated to the control module. The control module controls the electric pre-charging circuit. The electric pre-charging circuit includes at least one first solid-state switch. The electric pre-charging circuit is integrated on the support. An electric active discharge circuit of the load is operatively associated to the control module. The control module controls the electric active discharge circuit. The active discharge circuit includes at least one second solid-state switch. The electric active discharge circuit is integrated on the support. The first solid-state switch and the second solid-state switch act either as a switch or as a variable resistor.

The present invention further relates to a system for moving an electric or hybrid traction vehicle using such an electronic device.

BRIEF DESCRIPTION OF THE DRAWINGS

Other advantages of the invention will be readily appreciated as the same becomes better understood by reference to the following detailed description when considered in connection with the accompanying drawings, wherein.

It is noted that equal or similar elements in the aforesaid figures will be indicated hereinafter with the same numeric or alphanumeric references.

DETAILED DESCRIPTION OF THE INVENTION

Figure 2:
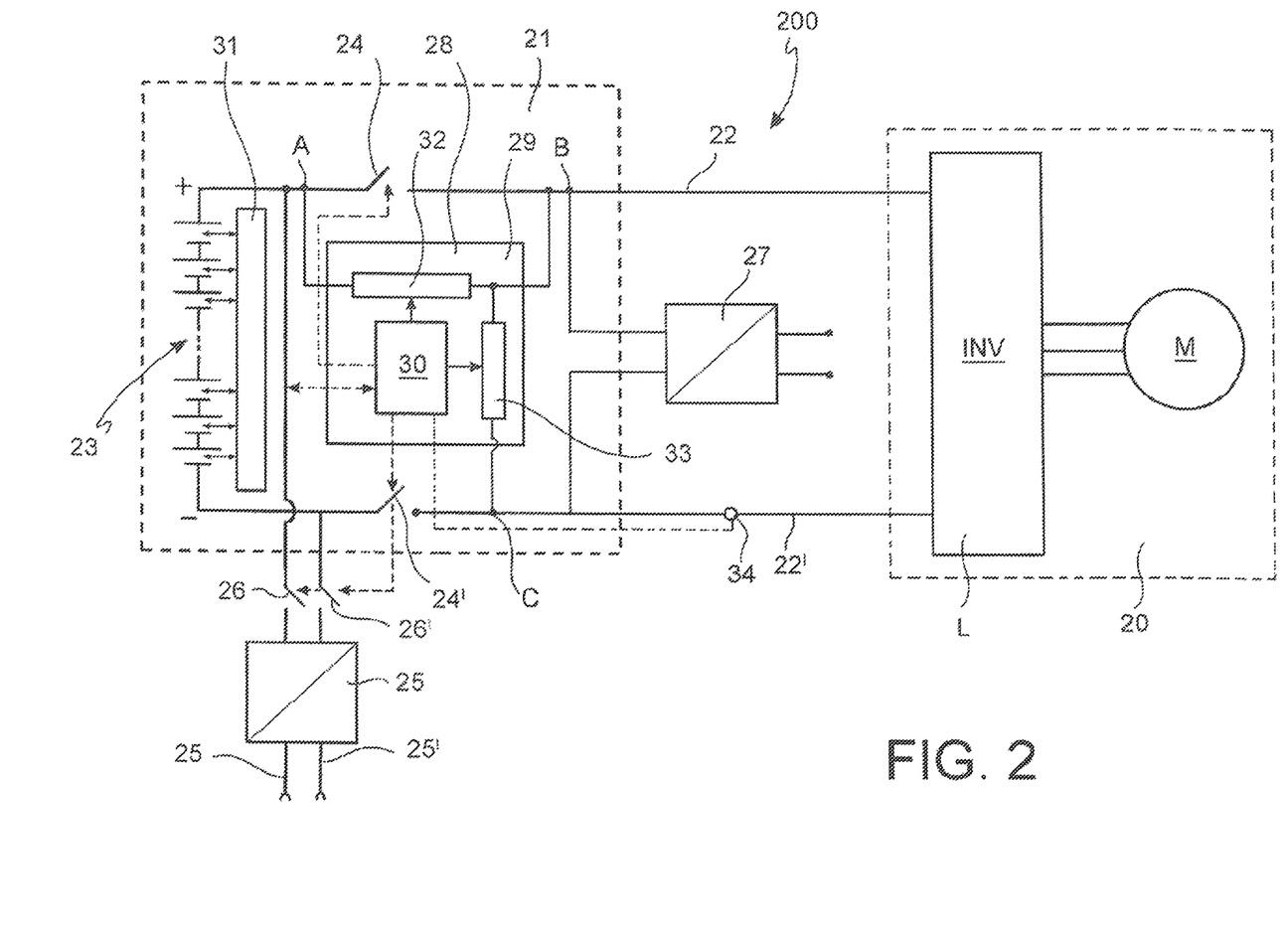
FIG. 2 diagrammatically shows, from an electric point of view, a system for moving an electric or hybrid traction vehicle in which an electronic device according to an embodiment of the present invention is employed.

With reference to FIG. 2, a system 200 for moving an electric or hybrid traction vehicle, hereinafter also indicated simply as movement system or system, in which the electronic device according to the present invention can be employed, will be described.

In the embodiment shown in FIG. 2, the system 200 comprises a load unit 20 comprising an inverter INV and an electric motor M for generating motion.

The inverter INV of the load unit 20 represents a load, also indicated by reference L, to be electrically supplied by the battery pack 21.

The system 200 further comprises a battery pack 21 operatively connected to the load unit 20 by a first electric terminal or bus 22 and a second electric terminal or bus 22', generally indicated with the expression DC-BUS.

It is noted that in another embodiment (not shown in the figures), the system 200 may not comprise the load unit 20.

In such a case, the battery pack 21 is adapted to be operatively connected to the load unit 20 by the first electric terminal or bus 22 and the second electric terminal or bus 22'.

Referring back to the embodiment shown in FIG. 2, the battery pack 21 comprises a plurality of electric charge electrochemical cells 23 distributed between a positive pole (+) and a negative pole (−) of the battery pack 21.

In the example shown in FIG. 2, the plurality of electrochemical cells 23 comprises a string of electrochemical cells arranged mutually in series.

According to other examples, the plurality of electrochemical cells 23 may comprise multiple strings of the aforesaid type arranged mutually in parallel.

The positive pole (+) of the battery pack 21 is operatively connected to the first electric terminal 22 by an electro-mechanical isolation switch (relay) 24 which can be actuated to electrically exclude the plurality of electrochemical cells 23 from the motor unit 20 (and thus from the load L).

Similarly, in the embodiment shown in FIG. 2, the negative pole (−) of the battery pack 21 is operatively connected to the second electric terminal 22' by an electro-mechanical isolation switch (relay) 24', which can be actuated to electrically exclude the plurality of electrochemical cells 23 from the motor unit 20 (and thus from the load L).

According to a further embodiment, not shown in the figures, the system 200 may be free from the second electro-mechanical isolation switch 24', and thus the negative pole (−) of the battery pack 21 is operatively connected to the second terminal 22' in direct manner.

The system 200, in the embodiment shown in FIG. 2, further comprises a first AC/DC converter 25 for recharging the battery pack 21 through connection to an external supply electric network 25' (diagrammatically shown in FIG. 2 with a pair of terminals).

It is worth noting that in such an embodiment, the first AC/DC converter 25 is electrically connected to the first electric terminal 22 (in particular, to the positive pole (+) of the battery pack 21) by a third electro-mechanical isolation switch (relay) 26 and the second electric terminal 22' (in particular the negative pole (−) of the battery pack 21) by a fourth electro-mechanical isolation switch (relay) 26'. The third electro-mechanical isolation switch 26 and the fourth electro-mechanical isolation switch 26' can be actuated in order to electrically connect/disconnect the first AC/DC converter 25 from the battery pack 21.

Furthermore, again in the embodiment in FIG. 2, the system 200 comprises a second DC/DC converter 27 for electrically supplying loads at different electric voltage from the electric working voltage of the battery pack 21.

It is worth noting that the second DC/DC converter 27 is electrically connected directly both to the first electric terminal 22 and to the second electric terminal 22'.

It is further noted that, in the embodiment shown in FIG. 2, both the first AC/DC converter 25 and the second DC/DC converter 27 are external to the battery pack 21.

According to other embodiments (not shown in the figures), either the first AC/DC converter 25 or the second DC/DC converter 27 or both may be inside the battery pack 21.

Referring back to the embodiment shown in FIG. 2, the system 200 further comprises an electronic device 28 (hereinafter also electronic device or simply device) for controlling the electric charge of the load L which is electrically supplied by the battery pack 21. The device 28 is operatively associated to the battery pack 21. In greater detail, in the embodiment shown in FIG. 2, the device 28 is inside the battery pack 21. According to another embodiment, not shown in the figures, the device 28 may be outside the battery pack 21.

Referring back to FIG. 2, the device 28 comprises a support 29, e.g. a printed circuit, also named PCB, acronym of Printed Circuit Board.

It is noted that the term "printed circuit board" as used herein refers to a single layer or multiple layer support of either rigid or flexible insulating material provided with conductive material tracks or pads, on which electric or electronic components can be either connected or integrated inside.

The device 28 further comprises a control module 30 integrated in the support 29.

The control module 30, also named BMS (acronym of Battery Management System), will be described in greater detail below.

It is noted that the control module 30 comprises therein a microprocessor or microcontroller logic unit and a plurality of further components controlled by the same in order to manage further functions of the battery pack 21, also related to further electro-mechanical components present in the battery pack 21.

Referring back to FIG. 2, the device 28 further comprises an electric pre-charging circuit 32 (described in detail below) of the load L, operatively associated to the control module 30. The control module 30 controls the electric pre-charging circuit 32, as will be reiterated below.

Furthermore, the device 28 comprises an electric active discharge circuit (described in detail below) of the load L, operatively associated to the control module 30. The control module 30 is also controls the electric active discharge circuit 33, as will be reiterated below.

It is worth noting that in the embodiment shown in FIG. 2, the electric pre-charging circuit 32 and the electric active discharge circuit 33 are external to the control module 30.

According to an alternative embodiment, not shown in the figures, the electric pre-charging circuit 32 and the electric active discharge circuit 33 can be integrated in the control module 30. This advantageously allows to further reduce the size of the electronic device 28, and thus of the battery pack 21.

Referring back in general to the embodiment shown in FIG. 2, the system 200 further comprises a plurality of monitoring modules 31 of the plurality of electric charge electrochemical cells 23, also named BCM (acronym of Battery Cell Monitor).

The plurality of monitoring modules 31, arranged near the plurality of electric charge electrochemical cells 23, as diagrammatically shown in FIG. 2, is electrically connected to the control module 30.

The function of the plurality of monitoring modules 31 (BCM) is to constantly measure the electric and physical parameters of each single electrochemical cell, such as for example the electric voltage at its terminals, its temperature or the electric charge present therein.

Once acquired, the information representative of such measurements are communicated to the control module 30. Furthermore, the function of the plurality of monitoring modules 31 (BCM) and of the respective electric circuit is to correctly equalize or balance the electric charge between the electrochemical cells 23 of the battery pack 21.

Referring back to the control module 30, it is observed that it acts, on the basis of the execution of program codes stored therein, to manage in general the battery pack 21, so in particular it acts to control the electric charge of the load L supplied by the battery pack, as will be also described below.

It is noted that, for the purposes of the present description, "controlling" the electric charge of a load L electrically supplied by a battery pack means managing a step of pre-charging of the load L and of a step of active discharging, described below.

Referring back to the function of the control module 30, it is noted that it acts to perform, on the basis of the information provided by the plurality of monitoring modules 31 (BCM), a series of operations aimed at avoiding the occurrence of anomalous or potentially dangerous conditions which could comprise the integrity of the plurality of electric charge electrochemical cells 23, and thus of the battery pack 21.

With reference again to the pre-charging circuit 32, as will be also reiterated below, it is noted that it advantageously comprises a first solid-state switch.

Furthermore, the electric pre-charging circuit 32 of the load L is advantageously integrated in the support 29.

With reference instead to the electric active discharge circuit 33, as will be reiterated below, it advantageously comprises a second solid-state switch.

Furthermore, the electric active discharge circuit 33, in the embodiment shown in FIG. 2, is advantageously integrated on the support 29.

Referring back to the embodiment shown in FIG. 2, the system 200 further comprises at least one sensor 34 for detecting the electric current of the battery pack 21, operatively connected to at least either the first electric terminal 22 or the second electric terminal 22'.

In the example in FIG. 2, said at least one sensor 34 for detecting the electric current is operatively connected to the second electric terminal 22'.

It is noted that the control module 30 also receives the detected electric current signal from said at least one sensor 34.

Additionally, the control module 30 actuates the first electro-mechanical isolation switch 24 and the second electro-mechanical isolation switch 24', and possibly also the third electro-mechanical isolation switch 26 and the fourth electro-mechanical isolation switch 26', again in order to manage the control of the electric pre-charging of the load L to be electrically supplied by the battery pack 21.

The electric pre-charging circuit 32 of the load L and the electric active discharge circuit 33 of the load L will now be described with reference to FIGS. 2, 3 and 4.

Firstly, it is worth reiterating that "pre-charging" means a step of equalizing adapted to take the electric voltage at the terminals of the load L to the same working electric voltage value present at the terminals of the battery pack 21.

Indeed, the load L has a high input electric capacitance and a very low electric impedance. Similarly, the battery pack 2 has a very low internal electric impedance.

Therefore, if the load L were electrically connected to the battery pack 21 (by closing the first electro-mechanical isolation switch 24 and the possible second electro-mechanical isolation switch 24', where present), in the presence of significant differences between the electric voltage at the terminals of the load L and the electric voltage at the terminals of the battery pack 21, there could be a high electric flow in the system 200 which could damage not only the load L but possibly also the battery pack 21.

Figure 3:
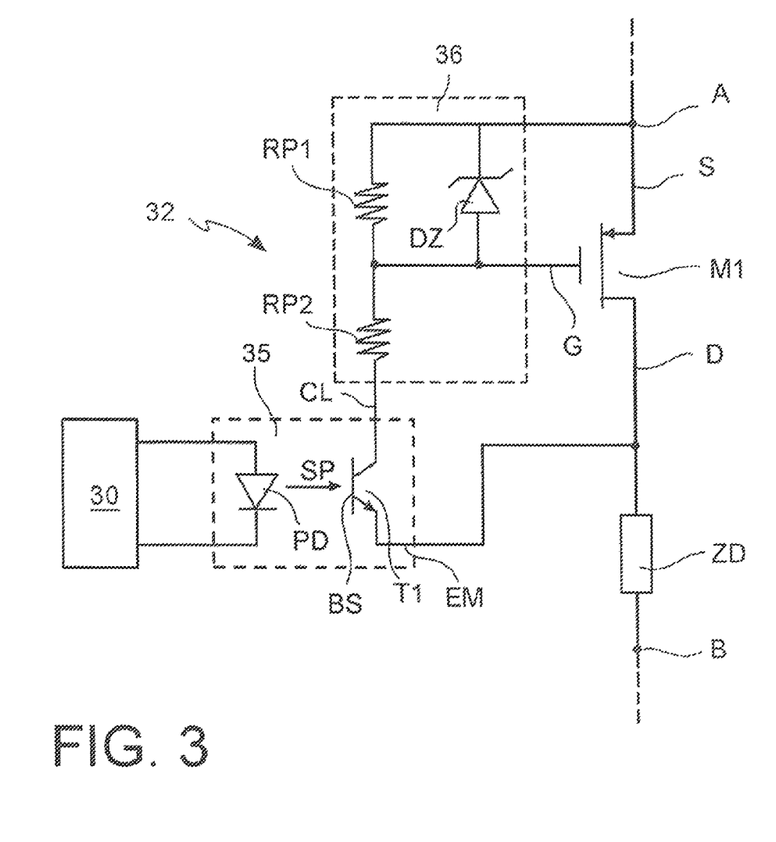
FIG. 3 diagrammatically shows, from the point of view of circuitry, an electric pre-charging circuit forming part of the electronic device, according to an embodiment of the invention.

With reference now to FIGS. 2 and 3, it is worth noting that the electric pre-charging circuit 32 is interposed between the plurality of electric charge electrochemical cells 23 and the load L, in parallel to the first electro-mechanical isolation switch 24 (FIG. 2).

In particular, the electric pre-charging circuit 31 is interposed between the first node A corresponding to the positive pole (+) of the battery pack 21 and a second node B corresponding to the first electric terminal 22. The first node A and the second node B are arranged at the terminals of the first electro-mechanical switch 24.

The electric pre-charging circuit 32 advantageously equalizes the electric voltage at the terminals of the load L, between the first electric terminal 22 and the second electric terminal 22', to the electric voltage at the terminals of the plurality of electrochemical cells 23, concurrently limiting the maximum electric current which can circulate between the battery pack 21 and the load L, before the first electro-mechanical isolation switch 24 is closed by the control module 30, for a set interval of time in the order of up to a few hundred of milliseconds, thus guaranteeing a minimum voltage drop at the terminals of the first electro-mechanical isolation switch 24 before it is closed, and thus limiting the so-called "inrush current" as much as possible.

FIG. 3, which shows the electric pre-charging circuit 32 from the circuitry point of view, also diagrammatically shows the control module 30; the first node A and the second node B are indicated in order to explain how the electric pre-charging circuit 32 is electrically connected within the system 200 of the embodiment in FIG. 2.

As mentioned, the electric pre-charging circuit 32 advantageously comprises a first solid-state switch, indicated with reference M1 in FIG. 3. Furthermore, it is worth reiterating that the electric pre-charging circuit 32 is advantageously integrated in the support 29, e.g. in a printed circuit (not shown in FIG. 3).

As will be also reiterated below, the first solid-state switch M1 comprises a transistor, e.g. of the MOSFET type, dimensioned so as to support and manage in appropriate manner the electric energy related to the pre-charging process, which typically varies from a few tens of Joule for 48-Volt battery systems to various hundreds of Joules, up to even a thousand Joules for battery systems with electric voltages of several hundreds of Volts, and drivable by the control module 30 with a set pulse train driving technique, which has a frequency in the order of several tens or hundreds of kHz compatibly with a low construction cost.

Driving techniques according to different embodiments will be described below.

Both these features of the electric pre-charging circuit 32 advantageously allow to guarantee a reliable step of pre-charging using an electronic circuitry which is rather simple, and thus is low cost to make.

With reference now to the electric active discharge circuit 33 (FIGS. 2 and 4), it is worth reiterating that "active discharge" means a quick discharge, e.g. in a time in the order of 100 ms up to a few seconds, of the electric working voltage at the terminals of the load L, i.e. between the first electric terminal 22 and the second electric terminal 22', in the moment in which the electro-mechanical isolation switch 24 and the further electro-mechanical isolation switch 24' are opened.

The electric active discharge circuit 33 is interposed between the second node B corresponding to the first electric terminal 22 and a third node C corresponding to the second electric terminal 22'.

The electric active discharge circuit 33 performs the function of rapidly discharging the electric voltage between the first electric terminal 22 and the second electric terminal 22', i.e. the electric voltage at the terminals of the load L, in the moment in which the first electro-mechanical isolation switch 24 and the possible second electro-mechanical isolation switch 24' are opened.

It is worth noting that the battery pack 21 further comprises an electric passive discharge circuit (not shown in the figures) of the load L, typically consisting of a resistor in parallel to the load L and always electrically connected thereto.

Unlike the electric active discharge circuit 33, adapted to allow to discharge the load L with electric current values in the order of even several tens of amperes and electric powers in the order of even several kW, the electric passive discharge circuit, which is always electrically connected to the load L, has much lower discharge current values (in the order of mA) and much lower electric powers (a few Watts).

Figure 4:
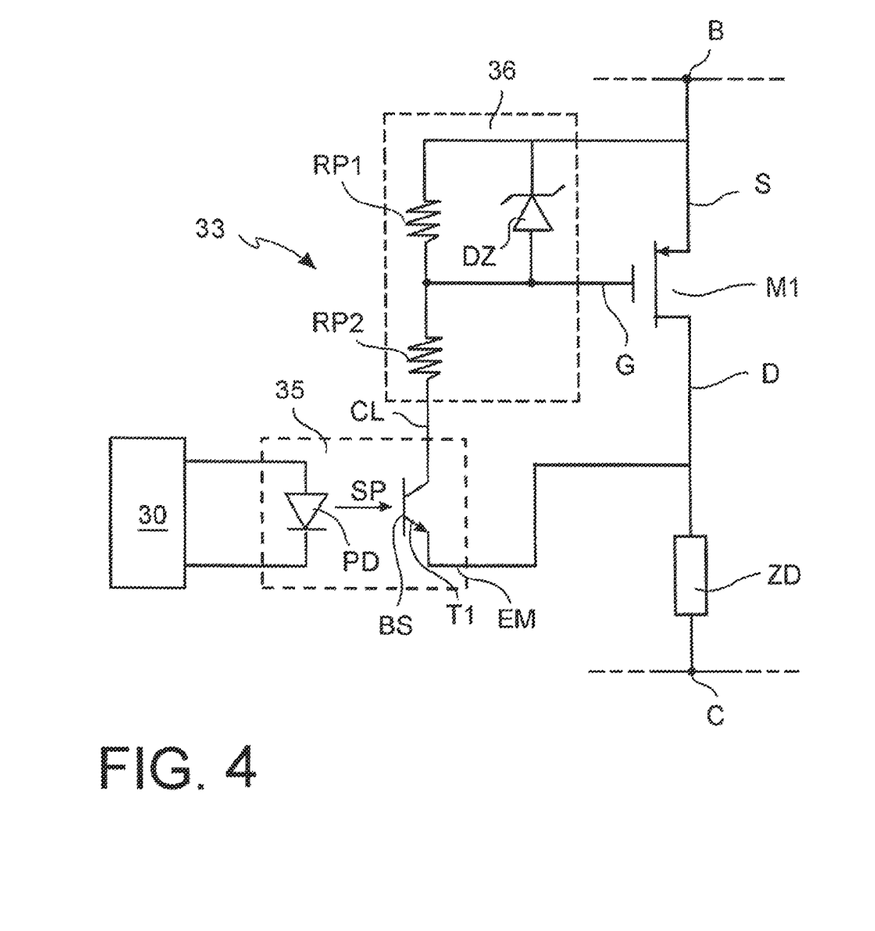
FIG. 4 diagrammatically shows, from the point of view of circuitry, an electric active discharge circuit forming part of the electronic device, according to an embodiment of the invention, and FIG. 5 diagrammatically shows, from the point of view of circuitry, an electric pre-charging circuit and an electric active discharge circuit forming part of the electronic device, according to a further embodiment of the invention.

FIG. 4, which shows the electric active discharge circuit 33 from the point of view of circuitry, diagrammatically shows also the control module 30 and the second node B and the third node C are indicated in order to explain how the electric active discharge circuit 33 is electrically connected inside the system 200 of the embodiment in FIG. 2.

As previously mentioned, the electric active discharge circuit 33 advantageously comprises a second solid-state switch, indicated with reference M1 in FIG. 4. Furthermore, it is worth reiterating that the electric active discharge circuit 33 is advantageously integrated in the support 29, e.g. in a printed circuit (not shown in FIG. 3).

With reference now to the embodiment shown in FIG. 3 and FIG. 4, it is worth noting that the electric pre-charging circuit 32 and the electric active discharge circuit 33 are equal from the point of view of circuitry.

Thus, hereinafter, the single components or electric elements will be described making reference to both the aforesaid circuits.

Firstly, the first solid-state switch M1 of the electric pre-charging circuit 32 and the second solid-state switch M1 of the active discharge circuit 33 comprise a respective transistor, e.g. of the MOSFET type, having a driving terminal G, a first polarization terminal S and a second polarization terminal D. In the case of the MOSFET type transistor, the driving terminal G is the gate terminal, the first polarization terminal S is the source terminal, while the second polarization terminal D is the drain terminal.

As will be also reiterated below, the first solid-state switch M1 comprises a transistor, e.g. of the MOSFET type, dimensioned so as to support and manage in appropriate manner the electric energy related to the active discharge process which typically varies from a few tens of Joules for 48-Volt systems to various hundreds of Joules, up to even a thousand Joules for battery systems with electric voltages of various hundreds of Volts, and drivable by the control module 30 with a set pulse train driving technique, which has a frequency in the order of several tens or hundreds of kHz compatibly with a low construction cost.

According to other embodiments, not shown in the figures, the first solid-state switch of the electric pre-charging circuit 32 and the second solid-state switch M1 of the active discharge circuit 33 could be a respective BJT bipolar transistor, a Triac transistor or a JFET transistor, a solid-state relay switch or any other solid-state switch, and so on.

Referring back to the embodiment shown in FIG. 3 and FIG. 4, the electric pre-charging circuit 32 and the electric active discharge circuit 33 comprise a respective interface module 35 that receives an electric driving signal SP, described hereinafter, from the control module 30 of the battery pack 21 and to transmit the driving signal SP to the transistor M1 (first solid-state switch or second solid-state switch).

In greater detail, the interface module 35 comprises an opto-isolated circuit.

This advantageously allows to increase the safety of the system 200 because it may be necessary to electrically insulate the ground of the battery pack 21 from the ground of the electric or hybrid traction vehicle. In other words, the electric insulation is needed to isolate the ground terminal of the control module 30 from the ground terminal of the battery pack 21.

Referring back to the interface module 35, indeed, it comprises a photodiode PD which is electrically connected to the control module 30 and a respective transistor T1 which is optically connected to the photodiode PD to receive an optical signal emitted by the photodiode which is representative of the electric driving signal SP.

The electric pre-charging circuit 32 and the electric discharge circuit 33 further comprise a respective polarization network 36 of the driving terminal G of the transistor M1.

The polarization network 36 is interposed between the interface module 35 and the driving terminal G of the transistor M1.

The polarization network 36 supplies the driving signal SP to the driving terminal G of the transistor M1.

From the point of view of circuitry, the anode terminal and the cathode terminal of the photodiode PD are electrically connected to the control module 30.

The transistor T1 of the interface module 35 has a driving terminal BS facing the photodiode PD, a first polarization terminal CL electrically connected to the polarization network 36 and a second polarization terminal EM electrically connected to the second polarization terminal D of the transistor M1.

In the embodiment shown in FIGS. 3 and 4, the transistor T1 of the interface module 35 is a bipolar transistor. Therefore, the driving terminal BS is the base terminal, the first polarization terminal CL is the collector terminal C, while the second polarization terminal EM is the emitter terminal.

Referring back to the interface module 35, according to another embodiment (not shown in the figure), it can be free from any opto-isolated circuit.

Referring back to the polarization network 36, it comprises a Zener diode DZ having the cathode electrically connected to the first polarization terminal S of the transistor M1 and the anode electrically connected to the driving terminal G of the transistor M1.

The polarization network 36 further comprises a first resistor RP1 electrically connected in parallel to the Zener diode DZ and a second resistor RP2 electrically connected between the driving terminal G of the transistor M1 and the first polarization terminal CL of the transistor T1 of the interface module 35.

In the case of the electric pre-charging circuit 32 (FIG. 3), the first polarization terminal S of the transistor M1 is electrically connected to the positive pole (+) of the battery pack 21 (first node A).

In the case of the electric active discharge circuit 33 (FIG. 4), the first polarization terminal S of the transistor M1 is electrically connected to the first electric terminal 22 (second node B).

Referring now to an embodiment, not shown in the figures, it is noted that the solid-state switch can also be a photomos switch adapted to receive the driving signal SP directly.

In such a case, the electric pre-charging circuit 32 and the electric active discharge circuit 33 would be free from the interface module 35 and the polarization network 36.

Referring back to FIG. 3 and to FIG. 4, the electric pre-charging circuit 32 and the second electric active discharge circuit 33 further comprise at least one corresponding circuit element ZD adapted to limit the electric current across it, which is electrically arranged in series with said at least one first switch M1 of the electric pre-charging circuit 32 and said at least one second switch M1 of the electric active discharge circuit 33, respectively.

In the embodiment shown in FIGS. 3 and 4, said at least one circuit element ZD is arranged electrically in series to the transistor M1 at the second polarization terminal D of the transistor M1.

In the case of the electric pre-charging circuit 32 (FIG. 3), the at least one circuit element ZD is electrically connected between the second polarization terminal D of the transistor M1 and the first electric terminal 22 (second node B).

In the case of the electric active discharge circuit 33 (FIG. 4), the at least one circuit element ZD is electrically connected between the second polarization terminal D of the transistor M1 and the second electric terminal 22' (third node C).

It is noted that the presence of said at least one circuit element ZD in series with the transistor M1 advantageously allows to limit the electric current peaks on the first electric terminal 22 and on the second electric terminal 22' (in the case of the electric pre-charging circuit 32 and of the electric active discharge circuit 33), thus avoiding possible interference of electromagnetic nature.

With reference to both the electric pre-charging circuit 32 and the electric active discharge circuit 33, according to different embodiments, said at least one circuit element ZD may comprise: one or more resistors electrically arranged in series; one or more inductors electrically arranged in series; an inductor and a resistor mutually electrically arranged in series. This advantageously allows to obtain a low electric energy dissipation associated to the step of pre-charging and to the step of active discharging of the load L.

It is worth noting that, in an embodiment, the inductor may be a technological component which can be inserted in the support 29 (printed circuit) of the device 28.

According to a further embodiment, the inductor may be obtained by winding a metallic connection (e.g. the metallic connection between the first electro-mechanical isolation switch—relay 24 and the second node B corresponding to the first electric terminal 22) about a sustaining element (e.g. a metallic material turret) inserted in the support 29 of the device 28.

In the latter case, considering that at the frequency of 100 kHz, a few tens of microhenries of inductance (e.g. 20 microhenries) are sufficient to adequately control the electric current, the use of this winding avoids the need to employ inductors as technological components mounted on the support 29 (PCB) of the device 28.

According to other embodiments, the electric pre-charging circuit 32 and the electric active discharge circuit 33 may be free from said at least one respective circuit element ZD. This allows to obtain a simple electronic device 28. One of these embodiments is illustrated in FIG. 5, which shows with a single circuit diagram both the electric pre-charging circuit 32 and the electric active discharge circuit 33.

It is worth noting that the alphanumeric references which differ between the electric pre-charging circuit 32 and the electric active discharge circuit 33 are represented next to one another, indicating in brackets the ones related to the electric active discharge circuit 33 alone.

Figure 5:
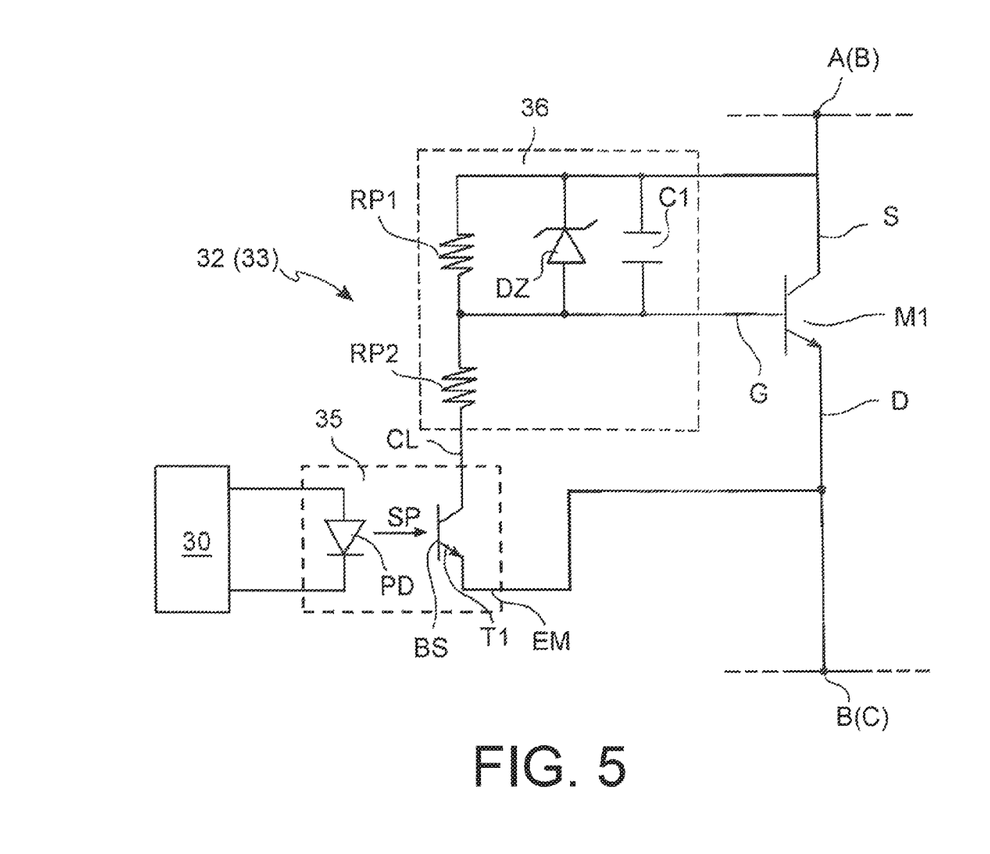

Therefore, with reference to FIG. 5, in the electric pre-charging circuit 32, the second polarization terminal D of the transistor M1 is electrically connected to the second node B, while in the electric active discharge circuit 33 the second polarization terminal D of the transistor M1 is electrically connected to the third node C.

Furthermore, in this embodiment, both in the electric pre-charging circuit 32 and in the electric active discharge circuit 33, the polarization network 36 of the driving terminal G of the transistor M1 comprises a capacitor C1 electrically connected in parallel to the Zener diode DZ, i.e. having a respective terminal electrically connected to the first polarization terminal S of the transistor M1 and a respective terminal electrically connected to the driving terminal G of the transistor M1.

Advantageously, the presence of the capacitor C1 allows, in the absence of the circuit element ZD, for the control module 30 to drive the transistor M1 in linear zone whether it is a BJT bipolar type transistor (as shown in FIG. 5) or a MOSFET type transistor (not shown in FIG. 5).

According to this embodiment, the first solid-state switch M1 or the second solid-state switch M1 are a transistor (of MOSFET type or of BJT bipolar type) and the polarization network 36 of the driving terminal G of the transistor M1 comprises the capacitor C1 having a respective terminal electrically connected to the first polarization terminal S of the transistor M1 and a respective terminal electrically connected to the driving terminal G of the transistor M1. The control module 30 drives the transistor M1 in linear zone.

Referring back in general to the embodiments in which the presence of the circuit element ZD is not provided in the electric pre-charging circuit 32 and in the electric active discharge circuit 33, in order to make up for the absence of said at least one circuit element ZD, the first solid-state switch M1 (transistor M1 in FIG. 5) and the second solid-state transistor M1 (transistor M1 in FIG. 5) may operate either as a switch or as a variable resistor.

Indeed, as mentioned above, the first solid-state switch M1 (and so also the second solid-state switch M1) comprises a transistor, e.g. of the MOSFET or indeed of the BJT type, dimensioned so as to support and manage in appropriate manner the electric energy related to the pre-charging process (or the active discharging process) which typically varies from a few tens of Joules for 48-Volt battery systems to various hundreds of Joules, up to even a thousand Joules for battery systems with electric voltages of various hundreds of Volts, and drivable by the control module 30 with a set pulse train control technique, which has a frequency in the order of several tens or hundreds of kHz compatibly with a low construction cost.

Therefore, in the embodiment in which the electric pre-charging circuit and the electric active discharge circuit are free from the circuitry element ZD, such a circuitry element ZD may correspond to the channel resistance (in the case of a MOSFET type resistor) of the transistor M1 (first solid-state switch or second solid-state switch).

With reference to the various embodiments described above, with regards to the pulse train driving technique of the first solid-state switch M1 or of the second solid-state switch M1, if the first solid-state switch M1 or the second transistor of the solid-state switch M1 is a MOSFET type transistor, according to an embodiment, the control module 30 drives the transistor M1 between the cut-off zone and the saturation zone. In such a case, the transistor M1 works as a switch (switching technique).

The switching technique consists in driving the transistor M1 with a driving signal SP having a duty-cycle variable over time, thus a specific pulse train at the set frequency, so as to switch the transistor M1 on and off to emulate the behavior of a set resistor.

If the transistor M1 is always of the MOSFET type, according to a further embodiment, the control module 30 drives the transistor M1 in a linear zone. In such a case, the transistor M1 works as a variable resistor.

In greater detail, it is noted that the driving of the transistor M1 (which may be a MOSFET type transistor or a BJT bipolar transistor) in a linear zone requires the use of a driving signal of analog type.

Consequently, with reference for example to the embodiment in FIG. 5, in which the first solid-state switch M1 or the second solid-state switch M1 is a transistor of BJT bipolar type and the control module 30 drives the transistor M1 in linear zone, the capacitor C1 and the second resistor RP2 (possibly also the first resistor RP1) of the polarization network 36 of the driving terminal G of the transistor M1 make an integrator filter of the digital driving signal SP (pulse train electric signal) to obtain a corresponding analog electric signal, adapted to be able to control the transistor M1 in linear zone, from said electric driving signal.

In other words, the polarization network 36 of the driving terminal G of the transistor M1 comprises an integrator filter of the pulse train electric signal to obtain a corresponding analog electric signal.

It is worth noting that the control module 30 executes the driving technique of the transistor M1 with a driving signal SP with a pulse train at a set frequency for a set minimum time interval, chosen as short as possible, e.g. comprised in the range of 100-200 ms.

It is known, in particular, that a pulse train driving signal SP at a set frequency equal to at least a few tens to a few hundred of kHz can already be available in the control module 30 (BMS). This advantageously allows to simplify the electronic device 28, and thus to reduce construction costs.

With reference again in general to the embodiment of the system 200 shown in FIG. 2, the system 200 comprises the control device 28 and a circuit element ZD (not shown in FIG. 2) adapted to limit the electric current which crosses said at least one first switch M1 of the electric pre-charging circuit 32 and said at least one second switch M1 of the electric active discharge circuit 33 present in the device 28.

According to different embodiments, said at least one circuit element ZD may comprise: one or more resistors electrically arranged in series; one or more inductors electrically arranged in series; an inductor and a resistor mutually electrically arranged in series. This advantageously allows to obtain a low electric energy dissipation associated to the step of pre-charging and to the step of active discharging of the load L.

According to an embodiment, a first portion of the circuit element ZD is comprised inside the device 28 and a second portion therefore is outside the device 28. According to a further embodiment, the circuit element ZD is outside the device 28. Both these embodiments allow to reduce the dimensions of the device 28.

It is worth noting that, according to both embodiments described above, the circuit element ZD is an inductor of which at least one portion is obtained by winding a metallic connection (e.g. the metallic connection between the first electro-mechanical isolation switch—relay—24 and the second node B corresponding to the first electric terminal 22) about a supporting element (e.g. a metallic material turret) inserted in a support 29 of the device 28.

An example of operation of the electronic device 28, when employed in the movement system 200, will be described with reference to the embodiment shown in FIGS. 2, 3 and 4.

The control module 30, after having closed the second electro-mechanical isolation switch 24' and before closing the first electro-mechanical isolation switch 24, executes the step of pre-charging of the load L.

In greater detail, the control module 30 provides the first solid-state switch M1 to the electric pre-charging circuit 32 with the electric driving signal SP.

The driving signal SP is determined by the control module 30 on the basis of a set minimum interval of time previously calculated of the electric charge of the load L (e.g. equal to 500 ms or comprised in the 100-200 ms range, according to the battery pack type), of a capacitance value of the load L, of a working electric voltage at the terminals of the load L (between the first electric terminal 22 and the second electric terminal 22') and of a maximum thermal power which can be dissipated by the electric pre-charging circuit 32.

It is worth noting that the set minimum interval of time for controlling the electric charge of the load L is calculated, by the control module 30, on the basis of the capacitance value of the load L, of the electric working voltage value at the terminals of the load L (between the first electric terminal 22 and the second electric terminal 22') and of the maximum thermal power value which can be dissipated from the electric pre-charging circuit 32.

In other words, in order to charge at constant electric current, the electric charge current value is established according to the features of the load L, i.e.: maximum electric current which can be accepted by the electronics and by the electric pre-charging circuit; duration of the pre-charge depending on the electric capacity of the load and of the electric voltage to be achieved.

In particular, having fixed the electric voltage of the battery pack and the load capacity L, the only degree of freedom to modify the duration of the pre-charging is that of intervening by modifying the electric current value which in all cases cannot be excessively high. Therefore, in some conditions, it is acceptable to have longer pre-charging times to not excessively stress the electric components present in the electric pre-charging circuit, so in general in the device 28.

It is further noted that the determined electric driving signal SP, as mentioned above, is an electric pulse train signal of a fixed period (i.e. the frequency of the PWM, acronym of Pulse Width Modulation, signal is fixed) having a duty cycle, during the minimum control time of the electric charge of the load L, gradually increasing starting from a value which is substantially zero.

The Applicant has noticed that a driving signal SP of this type advantageously allows to actuate the first solid-state switch M1 so as to adjust the equivalent resistance thereof and have, for example, a pre-charging electric current which is as constant as possible over time and has a limited absolute value.

According to an embodiment, the electric driving signal SP is a square wave signal of the PWM type.

After having completed the step of pre-charging, the control module 30 closes the first electro-mechanical isolation switch 24 and opens the first solid-state switch M1 of the electric pre-charging circuit 32.

In the step of active discharging, the control module 30 opens both the first electro-mechanical isolation switch 24 and the second electro-mechanical isolation switch 24' and proceeds with the step of active discharging.

The step of active discharging is executed by the control module 30 in the same manner as the step of pre-charging.

In particular, the control module 30 provides the second solid-state switch M1 of the electric active discharge circuit 33 with the respective driving signal SP determined in the same manner and in manner entirely similar to the driving signal SP supplied to the first solid-state switch M1 of the electric pre-charging circuit 32.

As can be seen, the object of the present invention is fully reached because the electric pre-charging circuit and the electric active discharge circuit comprise a respective solid-state switch instead of a respective electro-mechanical switch (relay), and furthermore both the electric pre-charging circuit and the electric active discharge circuit are integrated in the same support (e.g. a printed circuit) in which the control module (BMS) is also integrated.

This allows therefore to greatly reduce the dimensions of the electronic device, thus of the battery pack (if the electronic device is inside the battery pack), in all cases and certainly of the movement system of the electric or hybrid traction vehicle.

Furthermore, such an electronic device, being integrated, is simpler to insert in the movement system (or in the battery pack), thereby guaranteeing shorter times and thus costs for wiring it in an electric or hybrid traction vehicle.

Furthermore, the fact of having replaced electro-mechanical isolation switches (relays) allows the electronic control device, and in general the system for moving the electric or hybrid traction vehicle, to be more reliable and safer than the movement system described with reference to the known technique.

Furthermore, with regards to the step of pre-charging and to the step of active discharging, the fact of being able to perform a pre-charge (or an active discharge) in controlled manner is certainly an advantage. Indeed, it is possible, for example with an electric current as constant as possible having limited maximum value, to pre-charge (or discharge) the load by fixing a set pre-charging (or active discharge) time.

Finally, another advantage resides in the power dissipation. Indeed, in a movement system of the prior art, as the one shown in FIG. 1, the thermal power associated to the step of pre-charging is dissipated nearly totally on the resistor of the pre-charging circuit 6.

In the solution of the present invention, such a thermal power is preferably dissipated on the transistor M1 by reducing the amount of power dissipated on the circuit element ZD (impedance) and consequently by limiting the dimensions of such a circuit element ZD.

Furthermore, with reference to the electric pre-charging circuit, the fact of providing an electric pre-charging current which is substantially constant over time allows to optimize the maximum initial value of the electric breakaway current and the duration of the minimum transient pre-charging time interval in the best manner possible.

Additionally, the fact that the electric pre-charging circuit comprises the first solid-state switch driven with a set driving technique (PWM pulse train) which is appropriately dimensioned (sufficiently high channel resistance) to limit the maximum electric pre-charging current value, with pre-charging duration as short as possible and with a substantially zero end of pre-charging resistance, allows to complete the pre-charging despite the presence of loads which are also resistive and not only capacitive without needing to use a more complex and costly DC/DC type converter.

Furthermore, it is worth noting that the control module 30 (BMS) has high frequency switching circuits inside, thus the driving of the first solid-state switch with the aforesaid driving technique may be obtained without additional costs.

Finally, the embodiment in which the electric pre-charging circuit 32 and the electric active discharge circuit 33 are integrated in the control module 30, the electronic device 28, thus the battery pack 21, is smaller in size and simpler to control.

These aspects obviously allow to achieve the objective of decreasing in particular the dimensions and the wiring associated to the pre-charging circuit.

A person skilled in art may make changes and adaptations to the embodiments of the device described above or can replace elements with others which are functionally equivalent to satisfy contingent needs without departing from the scope of protection of the appended claims. All the features described above as belonging to one possible embodiment may be implemented independently from the other described embodiments.

The invention claimed is:
1. An electronic device for controlling the electric charge of a load electrically supplied by a battery pack, comprising:
a support;
a control module integrated in the support;
an electric pre-charging circuit of the load, operatively associated to the control module, the control module acting to control the electric pre-charging circuit, the electric pre-charging circuit comprising at least one first solid-state switch, the electric pre-charging circuit being integrated on the support, an electric active discharge circuit of the load, operatively associated to the control module, the control module acting to control the electric active discharge circuit, the active discharge circuit comprising at least one second solid-state switch, the electric active discharge circuit being integrated on the support, wherein the first solid-state switch and the second solid-state switch act either as a switch or as a variable resistor, wherein the first solid-state switch and the second solid-state switch comprise a transistor having an electric driving terminal acting to receive an electric driving signal, a first polarization terminal and a second polarization terminal, wherein the electric driving signal is a pulse train electric signal, the transistor being of the MOSFET type or of the BJT bipolar type, the control module acting to drive the transistor in linear zone, and a polarization network of the driving terminal of the transistor comprising a pulse train electric signal to obtain a corresponding analog electric signal from said electric driving signal.

2. The electronic device as set forth in claim 1, wherein the electric pre-charging circuit and the electric active discharge circuit further comprise at least one respective circuit element, adapted to limit the electric current across it, arranged electrically in series with said at least one first switch of the electric pre-charging circuit and said at least one second switch of the electric active discharge circuit, respectively.

3. The electronic device as set forth in claim 2, wherein said at least one circuit element belongs to the group comprising: one or more resistors electrically arranged in series; one or more inductors electrically arranged in series; an inductor and a resistor mutually electrically arranged in series.

4. The electronic device as set forth in claim 2, wherein the electric pre-charging circuit and the electric active discharge circuit are free from said at least one respective circuit element.

5. The electronic device as set forth in claim 4, wherein the circuit element corresponds to the channel resistance of the first solid-state switch or second solid-state switch.

6. The electronic device as set forth in claim 1, wherein the electric pre-charging circuit and the electric active discharge circuit further comprise a corresponding interface module that receives an electric driving signal from the control module and to transmit the electric driving signal to the first solid-state switch and the second solid-state switch, said interface module comprising an opto-isolated circuit comprising a photodiode, which is electrically connected to the control module, and a second transistor, which is optically connected to the photodiode to receive an optical signal emitted by the photodiode, which is representative of the electric driving signal.

7. The electronic device as set forth in claim 1, wherein the electric pre-charging circuit and the electric active discharge circuit further comprise a respective polarization network of the driving terminal of the transistor, the polarization network being interposed between the interface module and the driving terminal of the transistor, and the polarization network provides the driving signal to the driving terminal to the transistor.

8. The electronic device as set forth in claim 7, wherein the polarization network comprises a capacitor having a terminal electrically connected to a first polarization terminal of the transistor and a respective terminal electrically connected to the driving terminal of the transistor, the electric driving terminal being a pulse train electric signal, and the control module being configured to drive drives the transistor in linear zone.

9. The electronic device as set forth in claim 1, wherein the electric driving signal is a pulse train electric signal, the transistor being of the MOSFET type, and the control module drives the transistor between the cut-off zone and the saturation zone.

* * * * *